(12) United States Patent
Liu

(10) Patent No.: US 6,583,656 B1
(45) Date of Patent: Jun. 24, 2003

(54) DIFFERENTIAL CLOCK DRIVER WITH TRANSMISSION-GATE FEEDBACK TO REDUCE VOLTAGE-CROSSING SENSITIVITY TO INPUT SKEW

(75) Inventor: Wing Faat Liu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/064,831

(22) Filed: Aug. 21, 2002

(51) Int. Cl.[7] .................................................. H03K 5/12
(52) U.S. Cl. ......................... 327/170; 327/108; 326/27
(58) Field of Search .............................. 327/258, 108, 327/112, 219, 222, 57, 333, 257, 170; 326/82, 83, 85, 86, 87, 91, 26–28

(56) References Cited

U.S. PATENT DOCUMENTS

| | | | |
|---|---|---|---|
| 4,227,095 A | 10/1980 | Bazil ........................... 327/100 |
| 4,458,213 A | 7/1984 | Quan ........................... 330/267 |
| 5,192,878 A | 3/1993 | Miyamoto et al. ............. 327/77 |
| 5,220,211 A | * 6/1993 | Christopher et al. ........... 326/90 |
| 5,493,657 A | 2/1996 | Van Brunt et al. .......... 710/305 |
| 5,504,443 A | 4/1996 | Gross et al. ................... 327/51 |
| 5,568,429 A | 10/1996 | D'Souza et al. ....... 365/189.05 |
| 5,656,960 A | * 8/1997 | Holzer ......................... 327/170 |
| 5,703,496 A | * 12/1997 | Sabin ............................ 326/27 |
| 5,748,070 A | 5/1998 | Priebe et al. .............. 340/146.2 |
| 5,825,819 A | 10/1998 | Cogburn ...................... 375/257 |
| 5,936,466 A | 8/1999 | Andoh et al. ................ 330/253 |
| 6,052,010 A | 4/2000 | Moyal ......................... 327/254 |
| 6,194,949 B1 | * 2/2001 | Hogeboom .................. 327/391 |
| 6,380,777 B1 | * 4/2002 | Degardin et al. ........... 327/170 |
| 6,392,446 B1 | 5/2002 | Reasoner et al. .............. 327/20 |

* cited by examiner

Primary Examiner—Timothy P. Callahan
Assistant Examiner—Linh Nguyen
(74) Attorney, Agent, or Firm—Stuart T. Auvinen

(57) ABSTRACT

A differential clock driver uses feedback to reduce timing skews between the true and complement differential outputs. Each of the differential outputs has a pull-up driver and a pull-down driver. Each pull-up or pull-down driver has an initial transistor and a final transistor in parallel to drive the output. A resistor separates gates of the initial and final transistors, causing a delay to enable the final transistor. A transmission gate provides feedback from the other output to the gate of the final transistor. When the other output is faster that the output being driven, the transmission gate transfers charge from the other output to the gate of the final transistor, causing it to speed up driving its output. This helps compensates for the timing skew between the outputs. Skews present on differential inputs can be compensated by the transmission gate feedback.

21 Claims, 4 Drawing Sheets

DIFFERENTIAL CLOCK DRIVER WITH TRANSMISSION-GATE FEEDBACK TO REDUCE VOLTAGE-CROSSING SENSITIVITY TO INPUT SKEW

BACKGROUND OF INVENTION

This invention relates to clock drivers, and more particularly for methods for differential clock driver circuits with skew tolerance.

Many complex digital systems rely on clocks to maintain timing boundaries and proper synchronization. Since clock lines are often long and may lead to many input, loading on clock lines is high. High-current clock drivers are needed to drive such large capacitive loads of a clock line.

Very high-speed systems sometimes use differential logic, where both a true and a complement signal are used for each input or output. External signal lines are often differential, such as when a twisted-pair cable is driven with both true and complement signals. Sometimes differential signals are used internally within a semiconductor integrated circuit (IC) chip, especially for clock lines since true and complement clock signals are needed by many logic blocks such as flip-flops and transmission gates.

Differential clock signals can be generated from a single clock input. FIG. 1 shows a prior-art differential clock driver that has a single-ended input. A single clock ICLK is input to inverters 10, 14. Inverter 10 drives the complement clock line, CLKB, while the true clock line CLK is driven by inverter 12.

A two-inversion delay (inverters 14, 12) occurs between ICLK and CLK, while only a one-inversion delay occurs to CLKB, caused by inverter 10. This can result in a timing difference or skew between CLK and CLKB. Such skews are undesirable. Since CLK and CLKB drivers may be located at different places on the layout of a chip, there is also skew problem due to process variation and layout routing. Thus even when input clocks are perfectly matched, some skew occurs.

FIGS. 2A–C are waveforms highlighting differential clock skews. FIG. 2A shows an input clock ICLK used to generate a differential clock. Ideally, the true and complement clock are exact inverses of each other with zero timing skew, as shown in FIG. 2B. The CLK and CLKB signals cross over at 1.25 volt, about half of the signal swing in the ideal case. The voltage at which the two signals have the same voltage at precisely the same time is known as voltage cross-over, or VOX.

The mis-match of delays in generating the true and complement clock signals introduces clock skew. FIG. 2C shows a more realistic case of differential clock skew. The CLK signal tends to have more delay than CLKB due to the additional inversion. Thus the CLK waveform is shifted to the right by a small amount relative to the CLKB waveform. The voltage cross-over occurs later than in the ideal case. The falling edge of CLK occurs late, so the VOX for the falling CLK edge is at a higher (earlier) voltage, such as 1.6 volts rather than 1.25 volts. For the rising edge of CLK, VOX is lower, since the falling edge of CLKB is faster than the rising edge of CLK. VOX for the rising edge of CLK is at 0.9 volt rather than 1.25 volts. Also, the rising edge of both clocks may be slower than the falling edges, which can also lower VOX for both cases.

Such skewed differential clocks may be used as input to more powerful clock drivers that are fully differential, having two (differential) clock inputs and two (differential) clock outputs. The final buffered differential clock can still have these clock skews even when fully differential clock drivers are used.

What is desired is a fully differential clock driver that is tolerant of clock skews on a differential clock input to the clock driver. A skew-reducing differential clock driver is desired.

DETAILED DESCRIPTION

The present invention relates to an improvement in differential clock drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that timing, voltage, and other skews can exist on a differential clock that is input to a differential clock driver. The inventor further realizes that such skew can be hard to predict and reduce in arbitrary systems where generation of the differential clock is not under control of the buffer designer. The inventor thus desires to compensate for such differential clock skew. Feedback is optionally employed in a fully differential clock driver to reduce such input skew.

Figure 1:
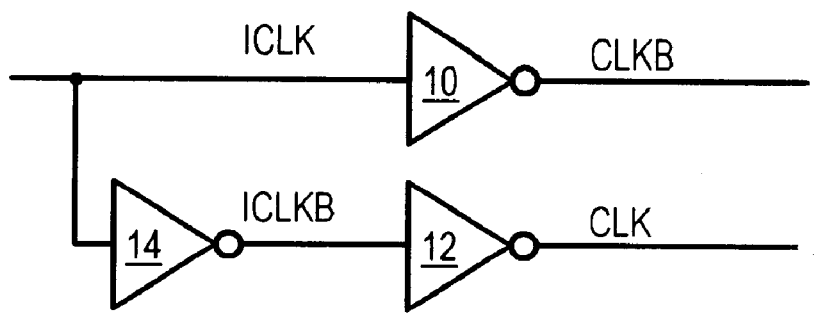
FIG. 1 shows a prior-art differential clock driver that has a single-ended input.
Figure 2A:
FIGS. 2A–C are waveforms highlighting differential clock skews.
Figure 2B:
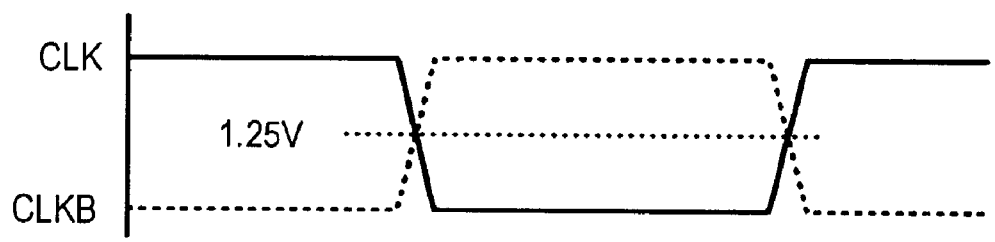
Figure 2C:
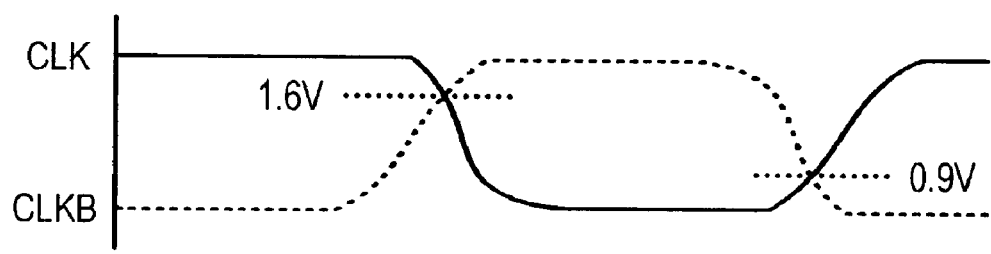
Figure 3:
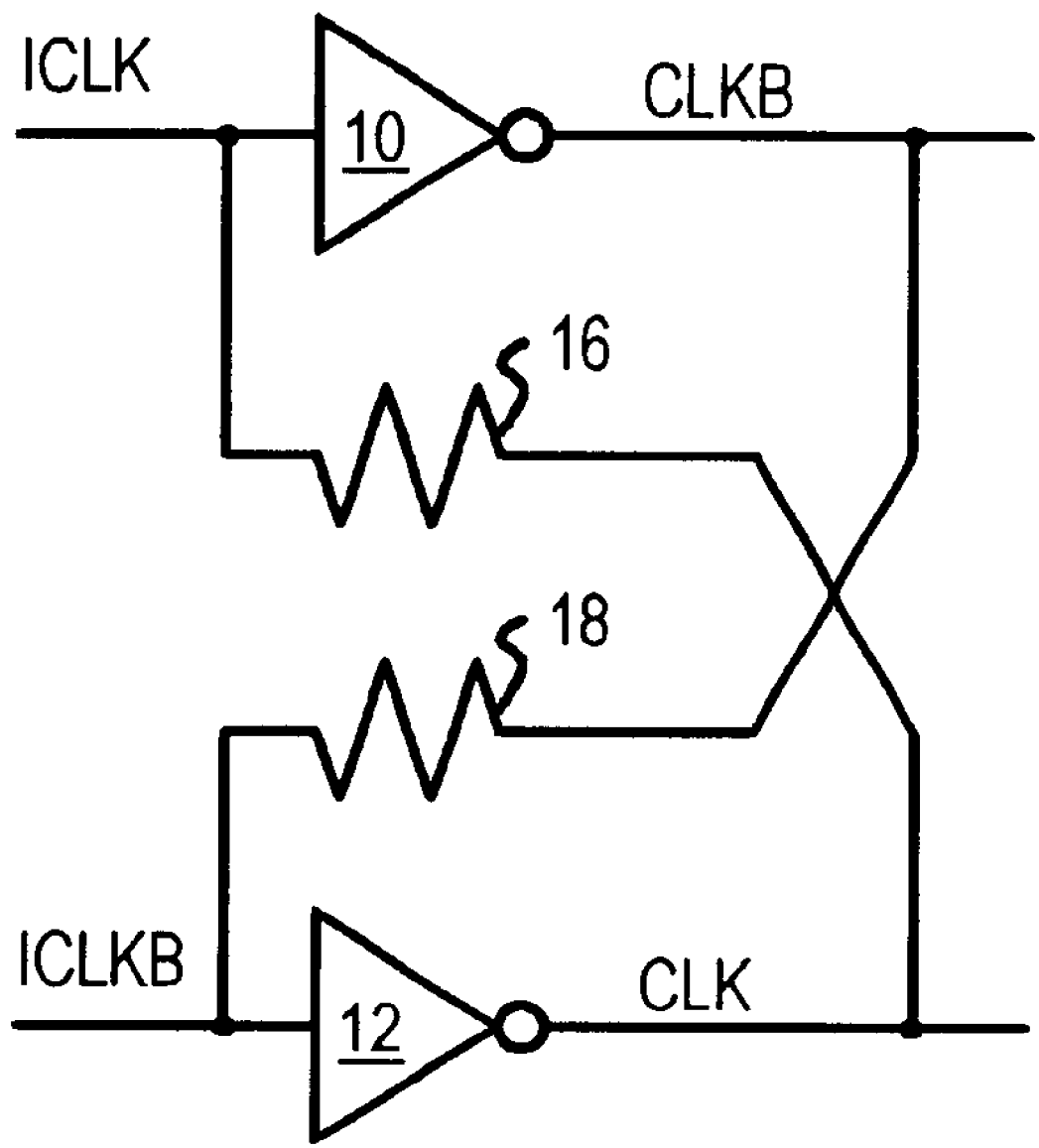
FIG. 3 is a diagram of a fully differential clock driver with feedback to reduce skew on the differential output clock.

FIG. 3 is a diagram of a fully differential clock driver with feedback to reduce skew on the differential output clock. When skew is present on the differential input clocks ICLK, ICLKB, feedback resistors 16, 18 act to reduce skew appearing on the differential clock outputs CLK, CLKB.

Inverter 10 inverts true input clock ICLK to drive complement output clock CLKB. Similarly, inverter 12 inverts complement input clock ICLKB to generate true output clock CLK. When skew occurs on output clocks CLK, CLKB, one of feedback resistors 16, 18 feeds more charge back to the input of one of inverters 10, 12, causing it to reach its input threshold voltage earlier and thus reduce skew.

For example, when CLK rising is slower than CLKB falling, feedback resistor 16 can steal charge from the input of inverter 10 to more rapidly raise CLK. The charge taken from the input of inverter 10 slows the rise of this input, which slows the fall of its output, CLKB. Thus charge sharing can speed up a slow edge and slow down the faster edge.

Such feedback may be undesirable for some systems, such as systems that have very low input-clock skew. Also if the system becomes unstable, it may be desirable to turn off such feedback to prevent the possibility of oscillation or secondary effects. Thus it is useful to be able to connect or disconnect the feedback resistors. It is especially useful if the end system designer can choose to connect or disconnect the feedback resistors, allowing the system designer to test both possibilities and choose the best option. The feedback may need to be disconnected when entering a high-impedance state.

Figure 4:
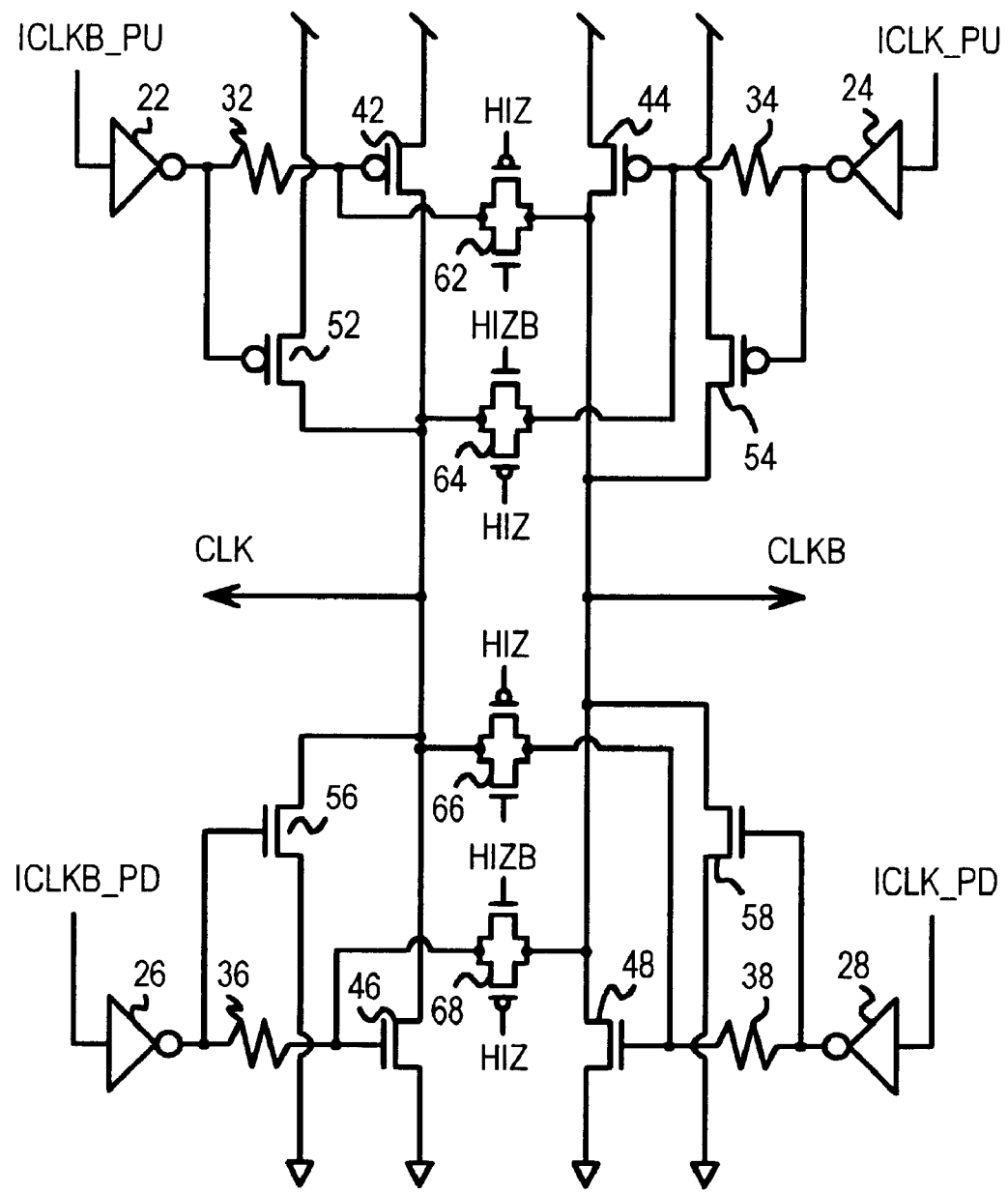
FIG. 4 is a schematic of a fully differential clock driver with feedback resistors that can be disconnected.

FIG. 4 is a schematic of a fully differential clock driver with feedback resistors that can be disconnected. Differential clock inputs ICLK, ICLKB are received by the driver. Each clock can be further divided or buffered to a pull-up and a pull-down input, such as ICLKB being divided into ICLKB_PU and ICLKB_PD. Alternately, a single ICLK and ICLKB input can be used.

Inverter 22 buffers ICLKB_PU to drive the gate of p-channel initial transistor 52, which initially pulls output CLK high. Inverter 22 also drives current through delay resistor 32 to the gate of p-channel final transistor 42, which continues to drive CLK high after an R-C delay through resistor 32. Thus initial transistor 52 first starts to pull CLK high, while final transistor 42 continues to pull CLK high after a delay. Using two transistors 52, 42 to pull CLK high allows the slew rate to be optimized and shaped, and can reduce electro-magnetic interference (EMI).

The true differential clock output CLK is also pulled low in two steps. Inverter 26 buffers ICLKB_PD to drive the gate of n-channel initial transistor 56, which initially pulls output CLK low. Inverter 26 also drives current through delay resistor 36 to the gate of n-channel final transistor 46, which continues to drive CLK low after an R-C delay through resistor 36. Thus initial transistor 56 first starts to pull CLK low, while final transistor 46 continues to pull CLK low after a delay.

The complement differential clock output CLKB is driven high and low in a similar fashion. Inverter 24 buffers ICLK_PU to drive the gate of p-channel initial transistor 54, which initially pulls output CLKB high. Inverter 24 also drives current through delay resistor 34 to the gate of p-channel final transistor 44, which continues to drive CLKB high after an R-C delay through resistor 34. Thus initial transistor 54 first starts to pull CLKB high, while final transistor 44 continues to pull CLKB high after a delay.

Inverter 28 buffers ICLK_PD to drive the gate of n-channel initial transistor 58, which initially pulls output CLKB low. Inverter 28 also drives current through delay resistor 38 to the gate of n-channel final transistor 48, which continues to drive CLKB low after an R-C delay through resistor 38. Thus initial transistor 58 first starts to pull CLKB low, while final transistor 48 continues to pull CLKB low after a delay.

Resistors 32, 34, 36, 38 provide isolation of initial transistors 52, 54, 56, 58 from other capacitances that must be charged or discharged during switching. This capacitance isolation allows the clock outputs CLK, CLKB to being to change while the large capacitances are being charged or discharged. Faster slew rates can result.

Resistors 32, 34, 36, 38 not only isolate initial transistors 52, 54, 56, 58 from final transistors 42, 44, 46, 48, but also provide isolation from the feedback mechanism. Feedback from the CLK, CLKB outputs is provided by transmission gates 62, 64, 66, 68. Feedback from the clock outputs is provided when HIZ is low and HIZB is high, turning on transmission gates 62, 64, 66, 68.

Transmission gate 62 feeds the clock output CLKB back to the gate of p-channel final transistor 42, which pulls CLK high. Transmission gate 64 feeds the true clock output CLK back to the gate of p-channel final transistor 44, which pulls CLKB low. For pull-down feedback, transmission gate 66 feeds CLK back to the gate of n-channel final transistor 48, which drives CLKB low, while transmission gate 68 feeds CLKB back to the gate of n-channel final transistor 46, which drives CLK low.

Feedback Theory of Operation

Transmission gate 62 feeds the clock output CLKB back to the gate of p-channel final transistor 42. When CLKB is faster falling than CLK is rising, the low CLKB output voltage is fed back through transmission gate 62 to the gate of p-channel final transistor 42. This lowered gate voltage on transistor 42 turns it on more strongly than without feedback, causing transistor 42 to more quickly pull up CLK. Transmission gate 62 also steals some negative charge from output CLKB, causing CLKB to fall less quickly. Thus when transmission gate 62 is activated it tends to even out timing skews among the two clock outputs. The degree or strength of the feedback depends in part on the on resistance of transmission gate 62. Smaller on resistances provide more feedback while smaller transistors and larger resistances provide less feedback.

Transmission gate 64 feeds the clock output CLK back to the gate of p-channel final transistor 44. When CLK is faster falling than CLKB is rising, the low CLK output voltage is fed back through transmission gate 64 to the gate of p-channel final transistor 44, lowering its gate voltage somewhat. This feedback-lowered gate voltage on transistor 44 turns it on more strongly than without feedback, causing transistor 44 to more quickly pull up CLKB. Transmission gate 64 also shifts some negative charge from output CLK to the gate of transistor 44, causing CLK to fall less quickly. However, this charge-sharing effect can be small when output capacitance is large. In contrast, the feedback effect to the gates of the final transistors can be more important and less sensitive to output capacitance, depending on design parameters.

For feedback to the pull-downs, transmission gate 66 compensated for CLK rising faster than CLKB falling. The relatively higher CLK voltage is fed back through transmission gate 66 to the gate of n-channel final transistor 48, charging the gate of transistor 48 more rapidly, and causing transistor 48 to draw more drain current. The higher current through transistor 48 causes CLKB to fall more rapidly, correcting for the timing skew.

Transmission gate 68 compensates for CLKB rising faster than CLK falling. The higher CLKB raises the gate voltage of n-channel final transistor 48, causing more pull-down current from CLK, and thus increasing the pull-down rate of CLK to compensate.

The transmission gates can be disabled by driving HIZ high and HIZB low. This can be a programmable feature, allowing a system designer to test feedback's effect. The HIZ, HIZB lines can be separately driven to different transmission gates, allowing some but not all of the feedback to be disabled. Additional transmission gates can be placed in parallel, and separately enabled, allowing the amount of feedback resistance to be selectable. The transmission gates can be disabled when the outputs need to be in high impedance.

Figure 5:
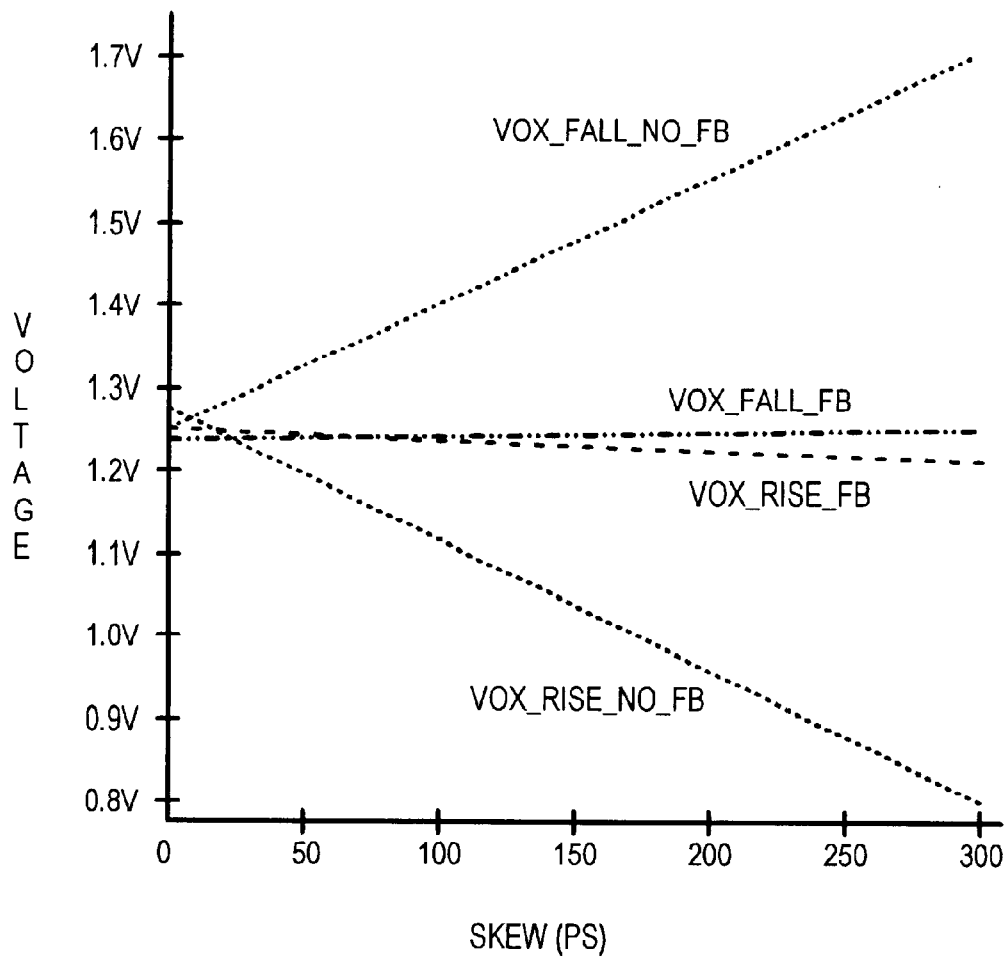
FIG. 5 is a simulation plot showing reduction of output-clock skew using the clock driver of FIG. 4.

FIG. 5 is a simulation plot showing reduction of output-clock skew using the clock driver of FIG. 4. A range of input clock skews are shown along the x-axis, from zero (no skew) to 300 pico-seconds. For each value of input-clock skew (timing difference between ICLK and ICLKB), the crossing voltage VOX is shown, where the true and complement output clocks CLK, CLKB have equal voltages. Since VOX can be different for rising and falling edges of a clock, VXO for both rising CLK and falling CLK is shown.

The rising and falling VOX values with feedback (VOX_FALL_FB and VOX_RISE_FB) are much less than VOX values with feedback disabled (VOX_FALL_NO_FB and VOX_RISE_NO_FB). For example, with an input skew of 300 pico-seconds, the crossing voltage for rising and falling edges are 0.8 and 1.7 volts, a difference of 0.9 volt. However, with feedback VOX is only 1.22 and 1.25 volts, a difference of 0.03 volt. Thus overall skew on the output is reduced from 0.9 volt to 0.03 volt using feedback. This is a reduction by a factor of 30, or about 97%. Of course, the actual reduction depends on many design factors, such as resistor values, clock speed, inverter delays, capacitances, etc.

ALTERNATE EMBODIMENTS

Several other embodiments are contemplated by the inventor. For example the feedback can also correct for process and transistor size variations. The outputs have been described as clocks, but other kinds of clock or other signals such as gated or qualified clocks, strobes, high-speed logic signals, etc can be driven as substitutes of the clock. The differential driver may also include a front-end of buffers or inverters. The front-end could have just a single non-differential clock input that is used to generate true and complement clock inputs to the main driver stage.

Rather than use full P,N transmission gates, single-transistor pass gates could be substituted. For example, all could use n-channel pass transistors, or pull-down transmission gates 66, 68 could just have p-channel transistors and no n-channel transistors, while pull-up transmission gates 62, 64 could just have n-channel transistors and no p-channel transistors. Resistors could be added in series with the transmission gates to increase feedback resistance. Other components such as additional transistors, resistors, and capacitors could be added at various points in the design and parasitic components are usually present.

The differential clock inputs can be gated with other signals, such as an output-enable signal. Having separate pull-up and pull-down inputs allows the pull-up inputs to be driven high while the pull-down inputs are driven low to disable the output buffer, placing it in a high-impedance state. HIZ can be driven high, and HIZB driven low to place the differential outputs in the high-Z state. Alternately, a single inverter could drive both the true pull-up and pull-down transistors while another inverter drives the complement pull-up and pull-down transistors.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential driver comprising:

a true output and a complement output driven to opposite states when signaling information;

a first true pull-up, coupled to the true output, for driving the true output high;

a second true pull-up, coupled to the true output, for driving the true output high;

a first feedback device, coupled between the complement output and a control gate of the second true pull-up, for accelerating driving of the true output high when the complement output is pulled low faster than the true output is pulled high;

a first complement pull-up, coupled to the complement output, for driving the complement output high;

a second complement pull-up, coupled to the complement output, for driving the complement output high; and a second feedback device, coupled between the true output and a control gate of the second complement pull-up, for accelerating driving of the complement output high when the true output is pulled low faster than the complement output is pulled high;

a first true pull-down, coupled to the true output, for driving the true output low;

a second true pull-down, coupled to the true output, for driving the true output low;

a third feedback device, coupled between the complement output and a control gate of the second true pull-down, for accelerating driving of the true output low when the complement output is pulled high faster than the true output is pulled low;

a first complement pull-down, coupled to the complement output, for driving the complement output low;

a second complement pull-down, coupled to the complement output, for driving the complement output low; and a fourth feedback device, coupled between the true output and a control gate of the second complement pull-down, for accelerating driving of the complement output low when the true output is pulled high faster than the complement output is pulled low, whereby feedback reduces cross-over skew of the true and complement outputs.

2. The differential driver of claim 1 further comprising:

a first delay device, coupled between a control gate of the first true pull-up and the control gate of the second true pull-up, for delaying activation of the second true pull-up relative to activation of the first true pull-up;

a second delay device, coupled between a control gate of the first complement pull-up and the control gate of the second complement pull-up, for delaying activation of the second complement pull-up relative to activation of the first complement pull-up;

a third delay device, coupled between a control gate of the first true pull-down and the control gate of the second true pull-down, for delaying activation of the second true pull-down relative to activation of the first true pull-down; and a fourth delay device, coupled between a control gate of the first complement pull-down and the control gate of the second complement pull-down, for delaying activation of the second complement pull-down relative to activation of the first complement pull-down, whereby activation is staggered by delay devices.

3. The differential driver of claim 2 wherein the first, second, third, and fourth delay devices each comprise a resistor.

4. The differential driver of claim 3 wherein the first, second, third, and fourth feedback devices each comprise:

an n-channel transistor having a gate driven high to conduct feedback current.

5. The differential driver of claim 4 wherein the first, second, third, and fourth feedback devices each further comprise:

a p-channel transistor, coupled in parallel with the n-channel transistor, having a gate driven low to conduct feedback current.

6. The differential driver of claim 3 further comprising:

a first inverter for driving the control gate of the first true pull-up, the first inverter receiving a true input or a derivative of the true input;

a second inverter for driving the control gate of the first complement pull-up, the second inverter receiving a complement input or a derivative of the complement input;

a third inverter for driving the control gate of the first true pull-down, the third inverter receiving a true input or a derivative of the true input; and a fourth inverter for driving the control gate of the first complement pull-down, the fourth inverter receiving a complement input or a derivative of the complement input.

7. The differential driver of claim 6 wherein the first and second true and complement pull-ups each comprise a p-channel transistor; and wherein the first and second true and complement pull-downs each comprise an n-channel transistor.

8. A differential output buffer comprising:

true initial pull-up means, responsive to a true initial gate that receives a complement differential input signal, for driving a true differential output high;

true final pull-up means, responsive to a true final gate that receives a delayed complement differential input signal, for driving the true differential output high;

first feedback means, coupled between a gate of the true final pull-up means and a complement differential output, for sharing charge among the gate of the true final pull-up means and the complement differential output;

complement initial pull-up means, responsive to a complement initial gate that receives a true differential input signal, for driving the complement differential output high;

complement final pull-up means, responsive to a complement final gate that receives a delayed true differential input signal, for driving the complement differential output high;

second feedback means, coupled between a gate of the complement final pull-up means and the true differential output, for sharing charge among the gate of the complement final pull-up means and the true differential output;

true initial pull-down means, responsive to a true initial gate that receives a complement differential input signal, for driving a true differential output high;

true final pull-down means, responsive to a true final gate that receives a delayed complement differential input signal, for driving the true differential output high;

third feedback means, coupled between a gate of the true final pull-down means and a complement differential output, for sharing charge among the gate of the true final pull-down means and the complement differential output;

complement initial pull-down means, responsive to a complement initial gate that receives a true differential input signal, for driving the complement differential output high;

complement final pull-down means, responsive to a complement final gate that receives a delayed true differential input signal, for driving the complement differential output high; and fourth feedback means, coupled between a gate of the complement final pull-down means and the true differential output, for sharing charge among the gate of the complement final pull-down means and the true differential output.

9. The differential output buffer of claim 8 further comprising:

true delay means, coupled to the complement differential output, for generating the delayed complement differential input signal from the complement differential input signal;

complement delay means, coupled to the true differential output, for generating the delayed true differential input signal from the true differential input signal.

10. The differential output buffer of claim 9 wherein the first, second, third, and fourth delay means each comprise a resistor.

11. The differential output buffer of claim 10 wherein the first, second, third, and fourth feedback means each comprise a pass transistor or a transmission gate.

12. The differential output buffer of claim 11 wherein the true initial pull-up means comprises a p-channel transistor having a source connected to a power supply;

wherein the true final pull-up means comprises a p-channel transistor having a source connected to the power supply;

wherein the complement initial pull-up means comprises a p-channel transistor having a source connected to the power supply;

wherein the complement final pull-up means comprises a p-channel transistor having a source connected to the power supply;

wherein the true initial pull-down means comprises an n-channel transistor having a source connected to a ground;

wherein the true final pull-down means comprises an n-channel transistor having a source connected to the ground;

wherein the complement initial pull-down means comprises an n-channel transistor having a source connected to the ground; and wherein the complement final pull-down means comprises an n-channel transistor having a source connected to the ground.

13. A differential clock driver comprising:

a first transistor having a drain connected to a first output node and a gate coupled to a first gate node;

a second transistor having a drain connected to the first output node and a gate coupled to a second gate node;

a first resistor coupled between the first gate node and the second gate node;

a first pass transistor having a source coupled to the second gate node and a drain coupled to a second output node;

a third transistor having a drain connected to the second output node and a gate coupled to a third gate node;

a fourth transistor having a drain connected to the second output node and a gate coupled to a fourth gate node;

a second resistor coupled between the third gate node and the fourth gate node;

a second pass transistor having a source coupled to the third gate node and a drain coupled to the first output node;

wherein the first output node and the second output node are differential outputs driven to opposite states during signaling;

wherein the first gate node and the third gate node are differential nodes driven to opposite states during signaling.

14. The differential clock driver of claim 13 further comprising:

a fifth transistor having a drain connected to the first output node and a gate coupled to a fifth gate node;

a sixth transistor having a drain connected to the first output node and a gate coupled to a sixth gate node;

a third resistor coupled between the fifth gate node and the sixth gate node;

a third pass transistor having a source coupled to the sixth gate node and a drain coupled to the second output node;

a seventh transistor having a drain connected to the second output node and a gate coupled to a seventh gate node;

an eighth transistor having a drain connected to the second output node and a gate coupled to an eighth gate node;

a fourth resistor coupled between the seventh gate node and the eighth gate node; and a fourth pass transistor having a source coupled to the eighth gate node and a drain coupled to the first output node;

wherein the fifth gate node and the seventh gate node are differential nodes driven to opposite states during signaling.

15. The differential clock driver of claim 14 wherein the first, second, third, and fourth transistors are p-channel transistors;

wherein the fifth, sixth, seventh, and eighth transistors are n-channel transistors.

16. The differential clock driver of claim 15 wherein the first, second, third, and fourth transistors have sources connected to a power supply;

wherein the fifth, sixth, seventh, and eighth transistors have sources connected to a ground.

17. The differential clock driver of claim 14 wherein the first, second, third, and fourth pass transistors are n-channel transistors with gates connected to a feedback signal that is high when feedback is enabled, but is low when feedback is disabled.

18. The differential clock driver of claim 17 further comprising:

a first p-channel pass transistor, having a gate driven with an inverse of the feedback signal, having a source connected to the drain of the first pass transistor and a drain connected to the source of the first pass transistor;

a second p-channel pass transistor, having a gate driven with an inverse of the feedback signal, having a source connected to the drain of the second pass transistor and a drain connected to the source of the second pass transistor;

a third p-channel pass transistor, having a gate driven with an inverse of the feedback signal, having a source connected to the drain of the third pass transistor and a drain connected to the source of the third pass transistor; and a fourth p-channel pass transistor, having a gate driven with an inverse of the feedback signal, having a source connected to the drain of the fourth pass transistor and a drain connected to the source of the fourth pass transistor, whereby transmission gates provide feedback.

19. The differential clock driver of claim 18 further comprising:

a first inverter for driving the first gate node and the fifth gate node with a clock signal;

a second inverter for driving the third gate node and the seventh gate node with and inverse of the clock signal.

20. The differential clock driver of claim 18 further comprising:

a first inverter for driving the first gate node with a clock signal;

a second inverter for driving the third gate node with and inverse of the clock signal;

a third inverter for driving the fifth gate node with a clock signal;

a fourth inverter for driving the seventh gate node with and inverse of the clock signal.

21. The differential clock driver of claim 20 wherein when the differential clock driver is to be disabled, the first inverter and second inverters are driven with low input signals and the third inverter and fourth inverters are driven with high input signals;

wherein when the differential clock driver is to be disabled, the feedback signal is driven with a low signal and the inverse of the feedback signal is driven with a high signal, whereby transmission gates are also disabled when the differential clock driver is disabled.

* * * * *